United States Patent [19]

Chu et al.

[11] Patent Number: 5,091,221
[45] Date of Patent: Feb. 25, 1992

[54] METHOD FOR PREPARING SUPERCONDUCTOR SPUTTERING TARGET

[75] Inventors: Jau-Jier Chu, Taipei; Ming-Chih Lai, Tai-Chung Hsien; Mei-Rurng Tseng; Huei-Hsing Yeh, both of Hsinchu, all of Taiwan

[73] Assignee: Industrial Technology Research Institute, Chutung, Taiwan

[21] Appl. No.: 571,138

[22] Filed: Aug. 22, 1990

[51] Int. Cl.$^5$ ............................................. B05D 5/12
[52] U.S. Cl. ............................... 427/282; 204/298.13; 204/192.24; 427/62; 505/1; 505/731; 505/741
[58] Field of Search ........................... 505/1, 731, 741; 427/62, 63, 282; 204/298.13, 192.24

[56] References Cited

FOREIGN PATENT DOCUMENTS 01-120089 3/1989 Japan .
01-270518 10/1989 Japan .

OTHER PUBLICATIONS

Tabuchi et al, "Preparation of Superconducting Y—Ba—Cu—O Thick Films with Preferred C-Axis Orientation, by a Screen-Printing Method", Appl. Phys. Lett. 53(7), Aug. 1988, pp. 606-608.
Yen et al, "High Tc Superconducting Y—Ba—Cu—O Thick Film by Screen-Printing"MRS, vol. 99, Nov. 1987, pp. 711-714.

Primary Examiner—Shrive Beck
Assistant Examiner—Roy V. King
Attorney, Agent, or Firm—Scully, Scott, Murphy & Presser

[57] ABSTRACT

A method for preparing a superconductor sputtering target is disclosed in which sputtering targets for coating superconductor films can be prepared essentially by mixing oxides (carbonates or fluorides) of metals such as Y, Ba, Cu (Bi, Pb), Sr, Ca,Cu) with the atomic ratio of individual elements be controlled in a specific range, an oxide superconductor paste being prepared by blending an organic binder and an organic solvent according to a specific solid percentage, and a metal such as aluminum being used as the substrate; by scraping with a squeegee and adjusting the distance between a stencil and the substrate such that the superconductor paste seeps through a mesh to be printed on the substrate and then dried; after scraping, screen-printing and drying having been repeated several times, the substrate being placed into an oven and heated to a temperature of 400°–450° C., at a rate of less than 5° C./min, for 30 minutes and then cooled down to room temperature at the same rate of less than 5° C./min.

7 Claims, 5 Drawing Sheets

METHOD FOR PREPARING SUPERCONDUCTOR SPUTTERING TARGET

BACKGROUND OF THE INVENTION

Since Drs Chu Ching-wu and Wu Mao-kun have successfully obtained materials having superconductive properties at a critical temperature of about 90 K from oxides of yttrium, barium, and copper in February 1987, numerous efforts all over the world have contributed to research in the field, and superconductors have become the focus in scientific and technological fields. Thereafter, oxides of bismuth, (lead), strontium, calcium, copper having critical temperatures of 80 to 110 K, followed by new superconductive materials—oxides of thallium, barium, calcium, copper—having critical temperatures of as high as 120 K have been disclosed one after another.

Since the superconductors have a resistance of zero and are capable of internally eliminating the magnetic field in response thereto, and thus resulting in magnetic levitation, they have potentially widespread applications. Among others, superconductive films play a rather important role in the electronics field. That is, the particular phenomenon of superconduction, or the "Josephson effect", can be used for making "Josephson devices" and "superconductive quantum interference devices" (SQUID), which will lead to unmeasurable innovations in modern electronics.

In general, superconducting films are made by means of either "evaporating" or "sputtering" methods, and the latter is more widely used. Briefly, in the so-called "sputtering" method, gas ions are used to bomb a target such that the splashed molecules of the material are sprayed onto a substrate to form into a film. To make films by means of "sputtering", however, there exists an important technical problem, that is, the making of the "sputtering target", which relates to the difficulty involved in sputtering the superconductor films and the quality thereof.

For example, the formation, compositions, uniformity, compactness, surface smoothness are all important factors which affect the sputtering and quality of the superconductor films. Therefore, how to make ideal superconductor sputtering targets is presently the most important subject.

Prior Art

Now in conventional method for making superconductor sputtering targets, powdered metal oxides of yttrium, barium, copper, etc. are stirred and mixed evenly according to fixed proportions, compressed into form utilizing special molds, and then sintered to be hardened at high temperatures. With said method, however, there are the following disadvantages:

1. Extremely high cost because of the large quantities of powdered metal oxides that are required:
By means of the conventional techniques, powdered metal oxides are compressed and sintered to form targets such that large quantities of powder would be required. It is expensive because at least 500 g of powder are required for each target. Therefore, the cost is extremely high and, hence, economically inefficient.

2. The overall process is substantially time-consuming and difficult to carry out:
Conventional techniques cannot be easily carried out as it would require special stirring apparatuses and molds. Much time would be spent for the processes of presintering, grinding and stirring, forming, sintering, etc. which are not common techniques that can be carried out in and suitable for mass production.

3. Difficult to mold and easily break or deform:
Powder molding techniques are extremely difficult. It is necessary to prepare expensive molds of different shapes and areas as actually desired. In addition, high pressure has to be applied to compress the mixed powder into form such that the targets are very likely to break due to improper control. Furthermore, the targets thus prepared still have inadequate compactness and deformations often occur during the sintering process.

4. It is difficult to make large area targets and cracks easily to occur:
To make large area targets with conventional techniques, it is necessary to prepare large molds for compressing the powder into form. However, such large molds are highly difficult to prepare and large targets are very likely to break due to the loose structure of the powder or cracks may occur during the sintering process. Targets prepared with conventional technique usually have an area of less than 4 square inches and thus have less practical value because they do not meet the requirements for various sputtering devices.

5. Targets prepared do not have required hardness:
In conventional techniques, the mixed powder that has been compressed and formed is hardened through the sintering process such that the targets thus prepared often do not have the desired hardness because the temperature for sintering is not easy to control.

6. Electric arcs often occur during the film sputtering process when using targets thus prepared:
Electric arcs may occur during the superconductor film sputtering process due to impurities contained in the targets or sharp angles, on sintered particles on the target surface, which will affect the quality of the superconductor films. With said technique, impurities that have often been introduced during the grinding and stirring steps together with the inadequate surface smoothness of the prepared targets due to poor uniformity of the powder are very likely to result in electric arcs.

7. Inability to change the proportional composition of the targets, resulting in severe waste.
Superconductors relate to a new advanced technology which is ever progressing with rapid steps. Of course, many problems are still to be solved and one example is to look for an optimal percentage for the targets through adjustment. With conventional techniques, if the compositions are found to be undesirable, the only solution is to dispose of the whole target and make a new one, which is not only a severe waste of material and labor spent in the process but also a substantial loss in the long range development of superconductors.

All of the above disadvantages are currently found to exist in the conventional methods and they are technically difficult to overcome, such that so far said method cannot be used for making targets in a simple manner suitable for mass production.

OBJECT OF THE INVENTION

In view of the fact that the currently available techniques are still unsuitable for mass production of targets for sputtering superconductor films in a simple manner and that the quality of the targets is difficult to control—a big obstacle to the development of the superconductor film sputtering technique—the inventors, after much research and experimentation, have finally invented a new method for sputtering targets in which powdered metal oxides such as oxides of yttrium, barium, copper, etc. are mixed and stirred with a vehicle to become an oxide superconductor paste, said vehicle being prepared from an organic binder and an organic solvent, the paste being printed on a stencil through a mesh by a squeegee which scrapes forth and back, while the stencil is oven-dried and finally heat treated, such that targets of good quality for sputtering superconductor films are obtained. The process of the present invention is simple to implement, time-saving, low in cost, and very suitable for mass production.

DETAILED DESCRIPTION OF THE INVENTION

Figure 1:
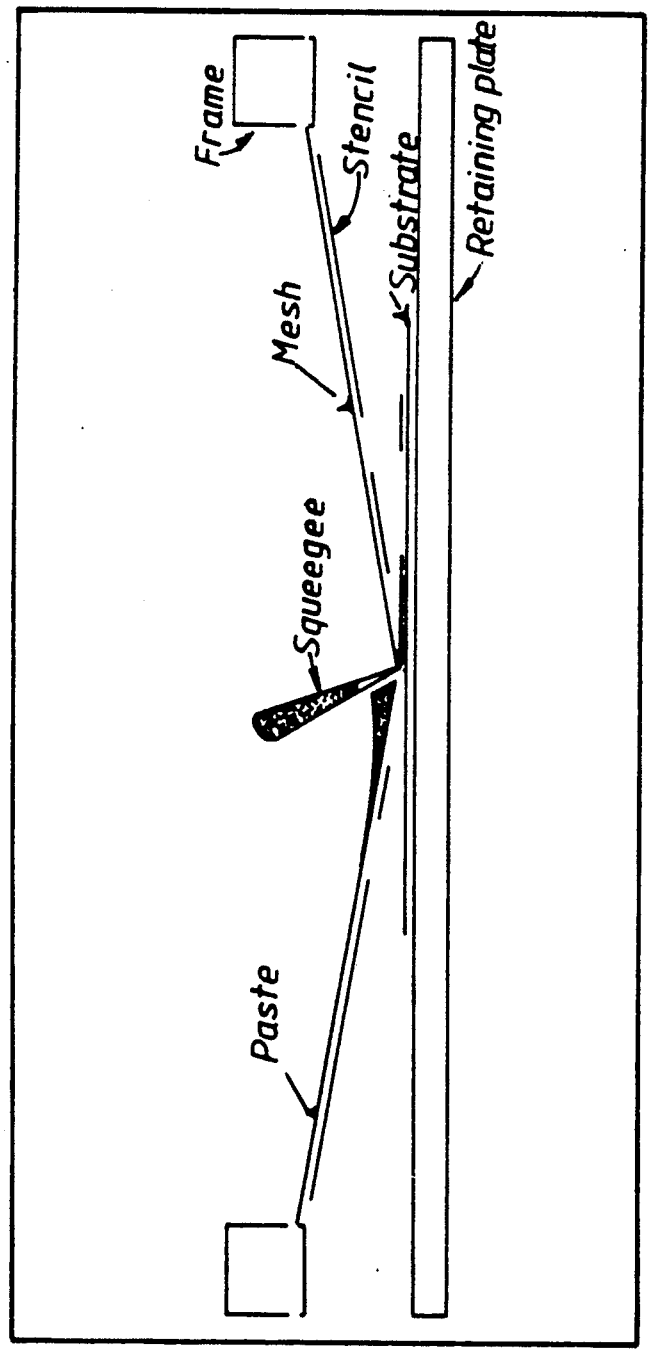
FIG. 1 is a schematic view showing the structure of the basic apparatus used for carrying out the present invention.

It should be noted that the present invention is suitable for making targets of various superconductive oxides of such as yttrium group (e.g., yttrium, barium, copper oxides); bismuth group (e.g., bismuth, (lead), strontium, calcium, copper oxides). For convenience, however, the present invention will now be described based on making targets of yttrium, barium, and copper oxides.

(1) Under the condition that yttrium, barium, and copper having the atomic ratio of 1:2:X ($3 \leq X \leq 5.5$) (1), have a proper amount of $Y_2O_3$, $BaCO_3$, and CuO powder and (2) are mixed up and ground evenly.
   Notes:
   1. The atomic ratio for bismuth, strontium, calcium, and copper is 1:1:3.5;
      The atomic ratio for bismuth, lead, strontium, calcium, and copper is 1.84:0.34:1.91:2.03:4.
   2. Carbonates or fluorides may be substituted by oxides of yttrium, barium, copper (bismuth, strontium, calcium, copper, bismuth, (lead), strontium, calcium, and copper.

(2) A vehicle obtained by blending an organic binder such as ethyl cellulose and an organic solvent such as butyl carbitol (in which the percentage by weight of the binder and the solvent is from 5:95 to 15:85) is added to the mixed powder prepared in Step (1) such that the vehicle and the mixed powder have a solid content percentage of 60-80 %, and are stirred evenly to become an oxide superconductor paste.

(3) The oxide superconductor paste 1 obtained in Step (2) is poured on a stencil 2 which is fitted thereon with a fine mesh 3, scraped over by a squeegee 4 such that the surface of the mesh 3 is coated with a layer of the paste 1, the stencil 2 is lowered such that when the squeegee scrapes back, the stencil is held at such a distance from the a substrate 5 as enabling the mesh to be in contact with the substrate, said substrate being fixed under the stencil by means of a retaining plate 6, and then scraped back by the squeegee, thus causing the paste to be printed on the surface of the mesh so as to form a layer of wet film. Thereafter, the stencil is raised to its original position.

(4) After step (3) has been repeated several times, the substrate having a wet film of yttrium, barium, and copper oxides printed thereon is bake-dried at a temperature of about 100° C.

(5) Steps (3) and (4) are repeated several times according to the thickness required for the target. Finally, the substrate having been printed thereon with the wet film of yttrium, barium, and copper oxides is placed into an oven and heated slowly from room temperature to a temperature of 400-450° C. at a rate of less than 5° C./min for about 30 minutes and then cooled down to room temperature also at the rate of less than 5° C./min, and a sputtering target for coating superconductor films can thus be obtained.

Other objects, features, and advantages of the present invention will be more clearly understood from the two examples given below.

Example 1

5 g of $Y_2O_3$, 17.48 g of $BaCO_3$ and 17.61 g of CuO are mixed with each other with the atomic ratio of yttrium, barium, copper being controlled to be at 1:2:5, are ground evenly, and then a vehicle prepared from 1 g of ethyl cellulose and 9 g of butyl carbitol is added and stirred to become an oxide superconductor paste. Using aluminum as a substrate which is cleaned and then secured under a stencil, said paste is poured on the stencil scraped forth and back by a squeegee, and the distance between the stencil and the substrate is adjusted such that the yttrium, barium, and copper oxides seep through a mesh to be printed on the substrate. After the process has been repeated for three times, the substrate is bake-dried at a temperature of 100° C. After the scraping and the screen-printing have been repeated three times, the substrate having a wet film of yttrium, barium, and copper oxides printed thereon is placed into an oven and heated to a temperature of 400° C. at the rate of less than 5° C./min Then, the substrate is removed from the oven and cooled down to room temperature at the rate of less than 5° C./min, and a sputtering target for coating yttrium, barium, and copper superconductor films can thus be obtained.

Example 2

4.66 g of $Bi_2O_3$, 2.96 g of $SrCO_3$, 1.12 g of CaO, and 5.58 g of CuO are mixed with each other with the atomic ratio of the bismuth, strontium, calcium, and copper being controlled to be at 1:1:1:3.5, and ground evenly, then a vehicle prepared from 0.358 g of ethyl cellulose and 3.222 g of butyl carbitol is added and stirred to become an oxide superconductor paste. Also, aluminum is used as a substrate and the subsequent scraping, screen-printing, bake-drying, and heating processing are carried out in the same manner as in Example 1. A sputtering target for coating bismuth, strontium, calcium, and copper oxide superconductor films can thus be obtained.

To verify that the superconductor films sputtered by using the targets prepared according to the present invention are of excellent quality, the targets prepared in Examples 1 and 2 underwent RF magnetron sputtering process (atmosphere: argon; pressure: $3 \times 10^{-3}$ torr; power: 150-200 W; distance between the single crystal substrate of magnesium oxide and the target: 7 cm) to obtain yttrium, barium, copper oxide superconductor films and bismuth, strontium, calcium, copper oxide superconductor films, respectively, through sputtering and then the following tests were performed:

1. The yttrium, barium, copper oxide superconductor films sputtered by using targets of Example 1

(1) Resistance test

Figure 2:
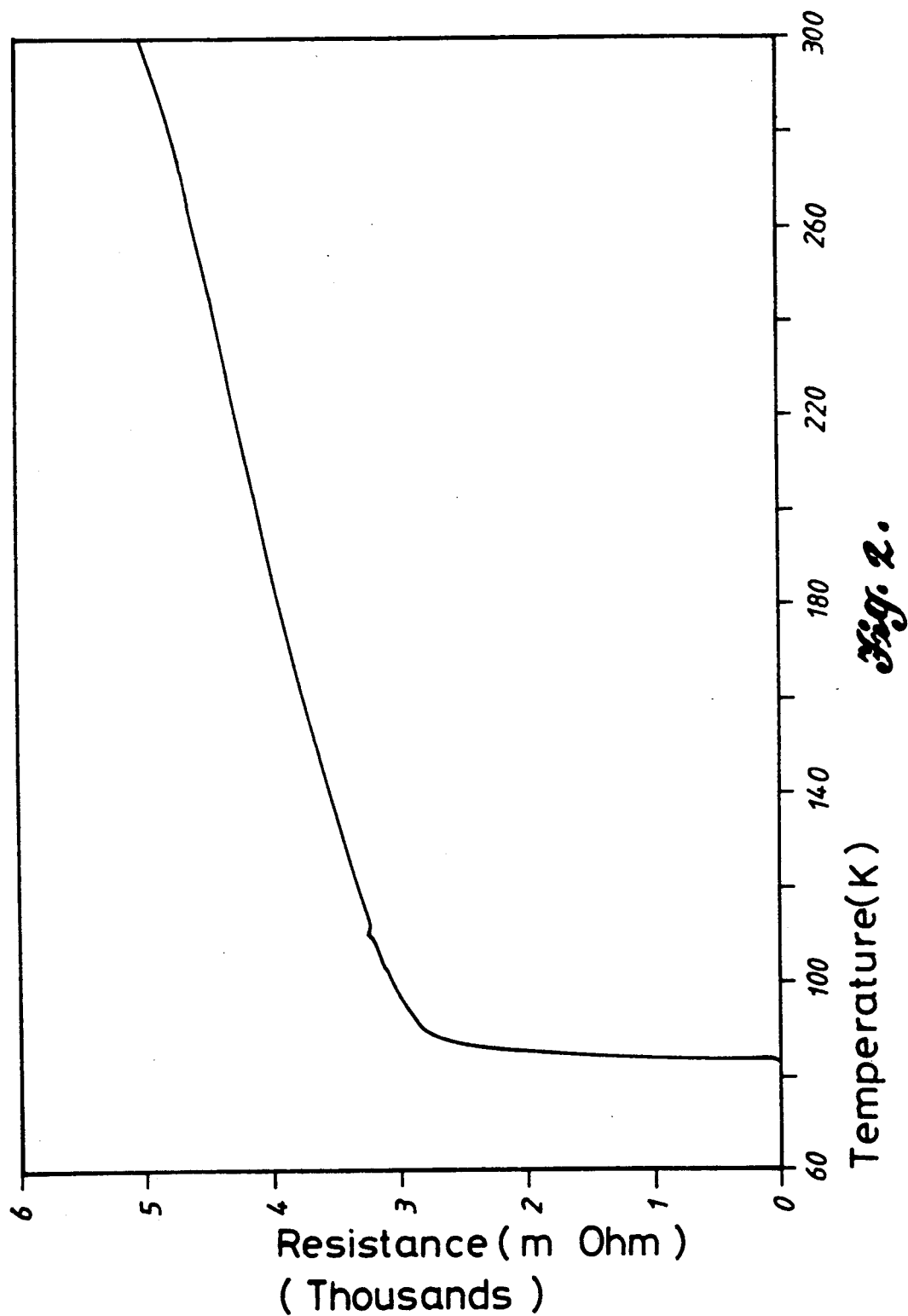
FIG. 2 is a diagram showing the relation of temperature corresponding to resistance for superconductor films of yttrium, barium, copper oxides which are sputtered by using targets made according to the present invention.

Referring to FIG. 2, said yttrium, barium, copper oxide superconductor films were tested for relation of changes in temperature with respect to resistance by means of AC four-point probe process and the following test results were obtained: T(onset)=83 K, To=80 K; in which T(onset) represents the temperature at the time when the resistance began to drop and To represents the temperature when resistance was zero.

(2) Identification by X-ray diffraction

Figure 3:
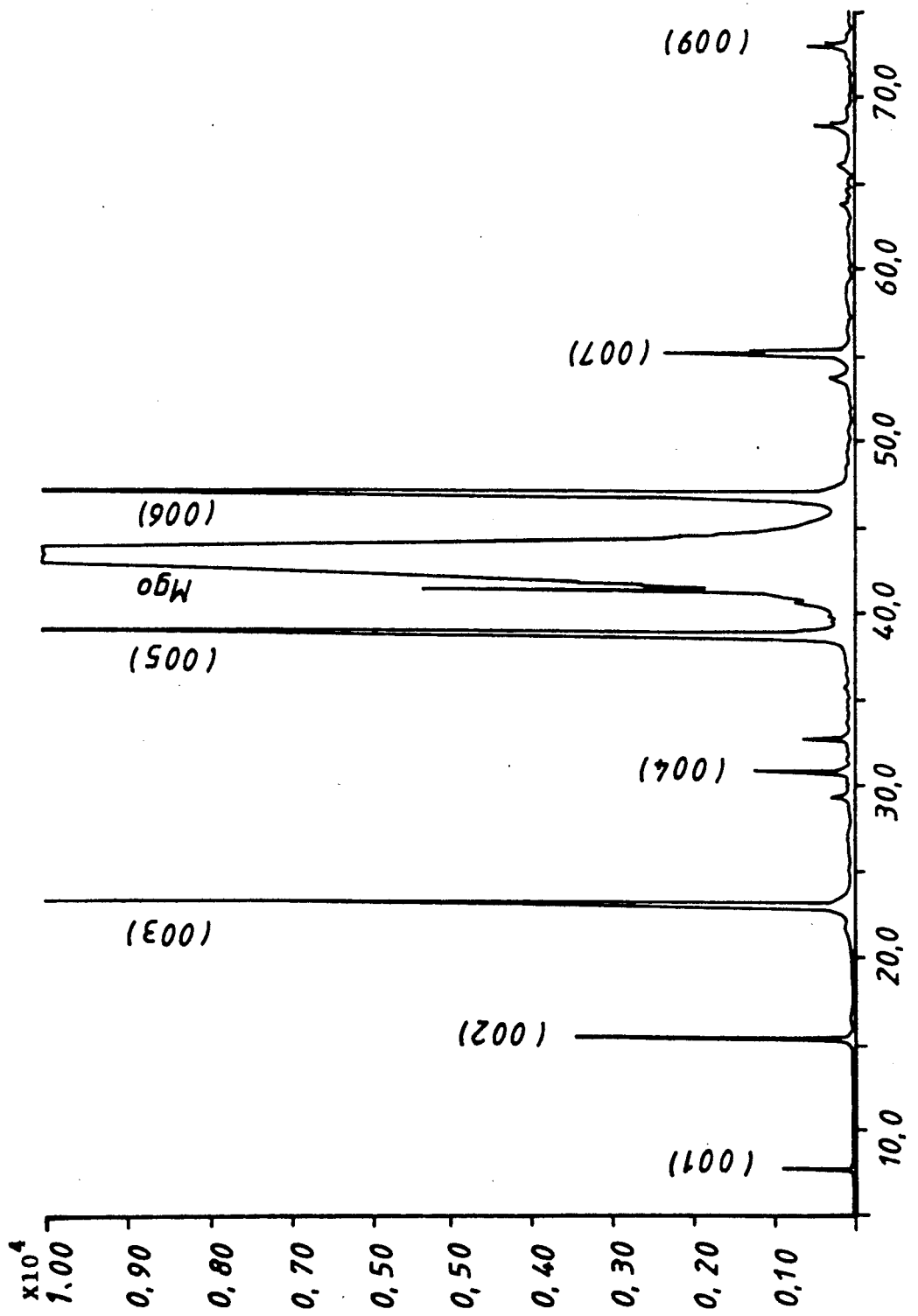
FIG. 3 is a diffraction diagram, as identified by an X-ray diffractometer, of the superconductor films of yttrium, barium, copper oxides which are sputtered by using targets made according to the present invention.

FIG. 3, shows the diffraction diagram as the crystal structure of said yttrium, barium, copper oxide superconductor films was tested by an X-ray diffractometer, the lateral axis representing the phase angle at which the X-ray diffracto-meter diffracted and the Y-axis representing the phase growth. It can be seen that the microscopic structure was found to have peak diffraction only in the direction of the C-axis normal to the direction of the substrate, that is (oo1)(1,2,3,...9) and very slight growth was found in other directions, showing that said superconductor films were of excellent quality.

2. The bismuth, strontium, calcium, copper oxide superconductor films sputtered by using targets of Example 1

(1) Resistance test

Figure 4:
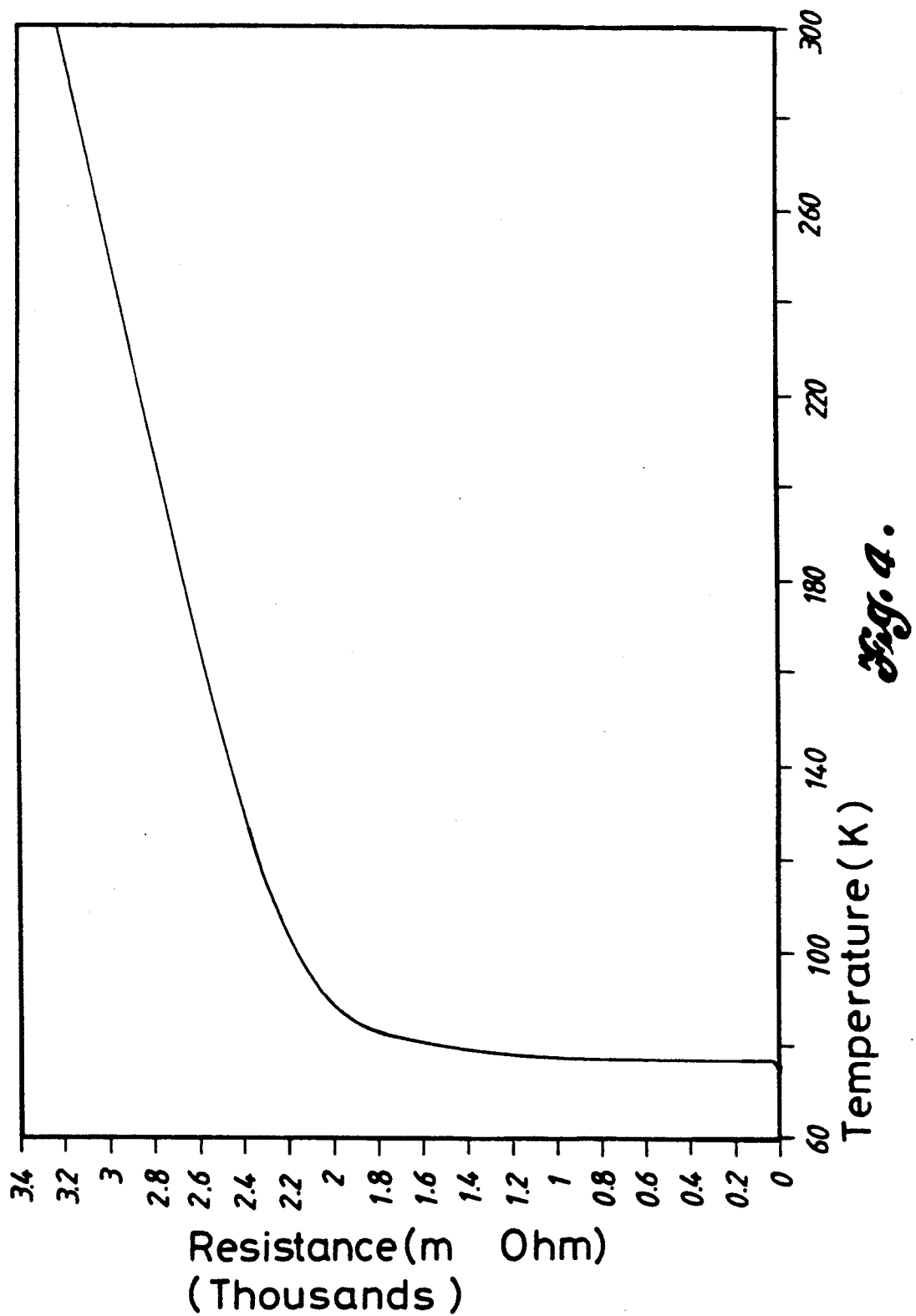
FIG. 4 is a diagram showing the relation of temperature corresponding to resistance for superconductor films of bismuth, strontium, calcium, copper oxides which are sputtered by using targets made according to the present invention.

Referring to FIG. 4, said bismuth, strontium, calcium, copper oxide superconductor films were tested for relation of changes in temperature with respect to resistance by means of AC four-point probe process and the following test results were obtained: T(onset)=100 K, To =72 K.

(2) Identification by X-ray diffraction

Figure 5:
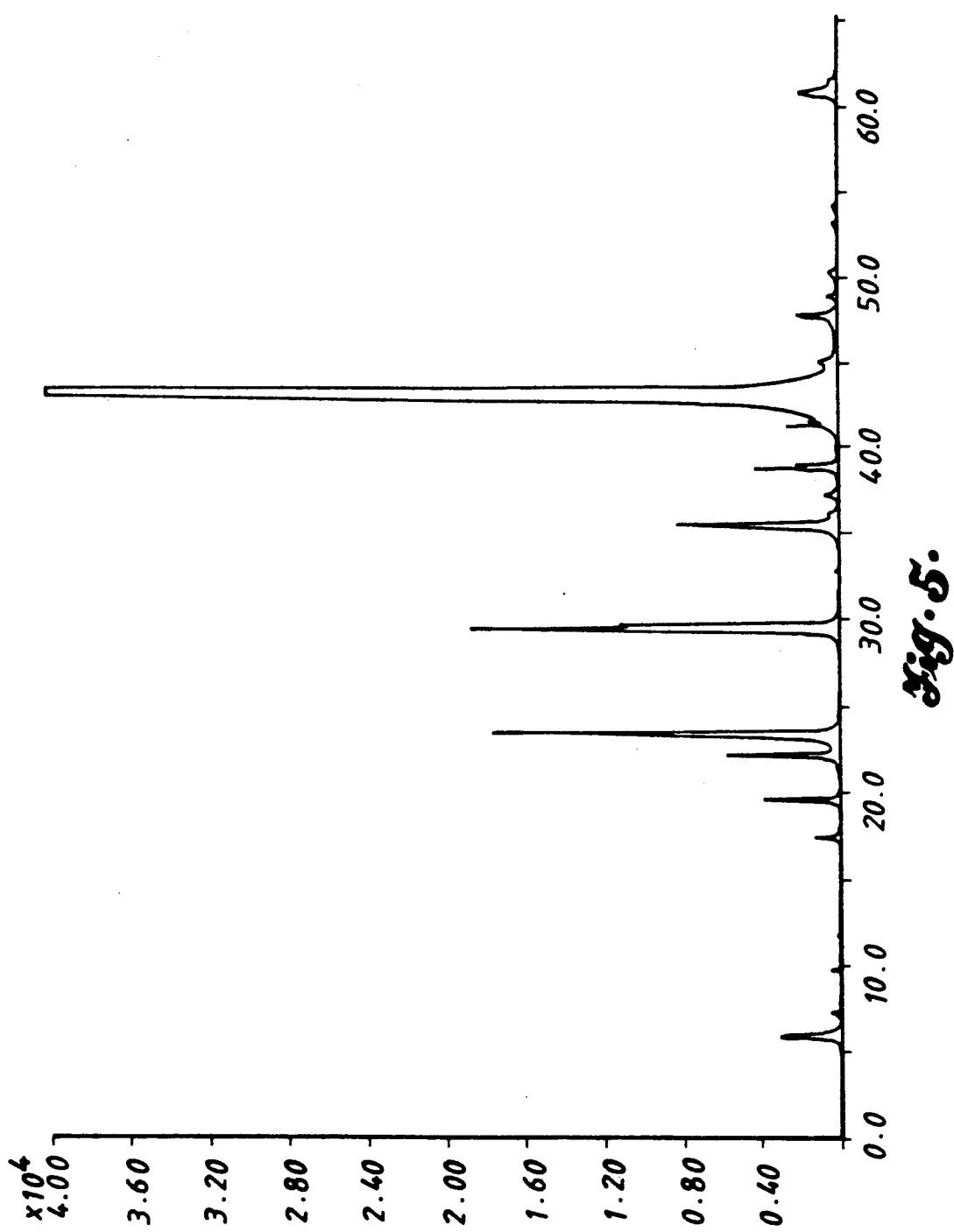
FIG. 5 is a diffraction diagram, as identified by an X-ray diffractometer, of the superconductor films of bismuth, strontium, calcium, copper oxides which are sputtered by using targets made according to the present invention.

FIG. 5 shows the diffraction diagram as the crystal structure of said bismuth, strontium, calcium, copper oxide superconductor films was tested by an X-ray diffractometer and the same results as those shown in FIG. 3 were obtained, showing that said superconductor films were of excellent quality.

From the foregoing, the targets prepared according to the present invention can be used for sputtering metal oxide superconductor films for good super-conductivity such that the practical value of the present invention can be positively confirmed.

Lastly, the advantages and functions of the present invention will be described:

1. Low cost because no large quantities of metal oxides are required:
    In the present invention, a paste prepared from metal oxides (carbonates or fluorides) and a vehicle is scraped and screen printed on a substrate to form into a film such that the cost for manufacturing can be substantially reduced because no large quantities of metal oxides are required.
2. Manufacturing process is simple, time-saving, and suitable for mass production:
    With the present invention, it is not necessary to provide special apparatuses, such that desired targets can be manufactured simply and quickly, thus rendering the process suitable for mass production and having high industrial utilization value.
3. The targets prepared have good compactness and are not liable to break or deformation.
    In the present invention, with the oxide superconductor paste being evenly scraped and printed on the substrate, the oxide film thus formed is compact in texture such that no breaks or deformation are likely to occur.
    The process target with no cracks:
    By selecting metal substrate of suitable size, it is simple to make targets having an area of more than 10 square inches, which is much larger than conventional targets, without having the danger of increasing cracks.
5. The targets prepared have good hardness:
    In the present invention, the metal substrate with the oxide film printed thereon is used as the target such that the target has good hardness because of the inherent hardness of the metal substrate.
6. No electric arcs occur during the sputtering process when using targets prepared according to the present invention:
    With the present invention, manufacturing is simple and fast, such that impurities are not likely to become introduced. In addition, the targets thus prepared have even and smooth surfaces due to good uniformity and compactness, such that no electric arcs will occur during the superconductor film sputtering process.
    It is easy to change the composition of the targets, favoring the long term development of superconductors:
    To make targets according to the present invention, if the compositions are found to be not quite desirable, it is possible to reformulate the oxide superconductor paste and have it directly reprinted on the substrate so as to adjust the proportion of the composition; or the substrate may have the film printed on the surface thereof washed off for reuse. With the conventional technique, however, the substrate would have to be disposed of. Therefore, the technique of the present invention not only saves material but also favorably meets the requirements for long term superconductor development.

From the foregoing, the method for preparing superconductor sputtering targets according to the present invention is innovative and, in addition, it is to be noted that the present invention covers all the changes and modifications that can be made thereto without departing from the scope and spirit thereof.

We claim:

1. A method for preparing a superconductor sputtering target comprising the steps of:
    (1) mixing powdered oxides, carbonates or fluorides of (a) yttrium, barium, copper or (b) bismuth, strontium, calcium, copper; or (c) bismuth, lead strontium, calcium, copper and adding a vehicle prepared by blending ethyl cellulose used as an organic binder and butyl carbitol used as an organic solvent to the mixture thereof, the percentage by weight of said binder and solvent being from 5:95 to 15:85, such that the vehicle and the mixed powder has a solid content percentage of 60-80% and then stirring to form an oxide super-conductor paste;

(2) pouring the oxide superconductor paste obtained in Step (1) on a stencil which is fitted thereon with a fine mesh and coating it over the surface of the mesh by using a squeegee, then lowering the stencil and scraping back with the squeegee such that the paste seeps through the mesh to have a layer of wet film printed on the substrate, said substrate composed of aluminum;

(3) repeating Steps (2) several time, said substrate having a wet film of the mixture printed thereon to be bake-dried;

(4) repeating Steps (2) and (3) several times and, finally, said substrate printed thereon with the wet film of the mixture being heated to a temperature of 400-500° C., at a rate of less than 5° C./min, holding said mixture at said temperature of 400-500° C. for about 30 minutes and then cooled down to room temperature also at the rate of less than 5° C./min.

2. The method as set forth in claim 1, wherein the elements of yttrium, barium and copper are in the atomic ratio of $1:2:x$ wherein $3 < x < 5.5$.

3. The method as set forth in claim 1, wherein the elements of bismuth, strontium, calcium, and copper are in the atomic ratio of 1:1:1:3.5.

4. The method as set forth in claim 1, wherein the elements of bismuth, lead, strontium, calcium, and copper are in the atomic ratio of 1.84:0.34:1.91:2.03:4.

5. The method as set forth in claim 1, wherein the oxides or carbonates of yttrium, barium, copper are $Y_2O_3$, $BaCO_3$, and $CuO$.

6. The method as set forth in claim 1, wherein the oxides or carbonates of bismuth, strontium, calcium, and copper are $Bi_2O_3$, $SrCO_3$, $CaO$, $CuO$.

7. The method as set forth in claim 1, wherein the oxides or carbonates of bismuth, lead, strontium, calcium, and copper are $Bi_2O_3$, $PbO$, $SrCO_3$, $CaO$, and $CuO$.

* * * * *